United States Patent
Lamb et al.

(10) Patent No.: US 10,367,477 B2
(45) Date of Patent: Jul. 30, 2019

(54) SPARSE CASCADED-INTEGRATOR-COMB FILTERS

(71) Applicant: Analog Devices, Inc., Norwood, MA (US)

(72) Inventors: David Lamb, Medford, MA (US); Luiz Chamon, Philadelphia, PA (US); Vitor H. Nascimento, Sao Paulo (BR); Adam R. Spirer, Westwood, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/735,495

(22) PCT Filed: Jun. 10, 2016

(86) PCT No.: PCT/US2016/036874
§ 371 (c)(1),
(2) Date: Dec. 11, 2017

(87) PCT Pub. No.: WO2016/201216
PCT Pub. Date: Dec. 15, 2016

(65) Prior Publication Data
US 2018/0159510 A1    Jun. 7, 2018

Related U.S. Application Data

(60) Provisional application No. 62/174,688, filed on Jun. 12, 2015.

(51) Int. Cl.
*G06F 17/17* (2006.01)
*H03H 17/06* (2006.01)
*H03H 17/02* (2006.01)

(52) U.S. Cl.
CPC .... *H03H 17/0671* (2013.01); *H03H 17/0225* (2013.01); *H03H 17/0664* (2013.01); *H03H 2017/0678* (2013.01)

(58) Field of Classification Search
USPC ......................................................... 708/313
See application file for complete search history.

(56) References Cited

U.S. PATENT DOCUMENTS 7,196,648 B1    3/2007 Ding et al.
9,324,025 B2    4/2016 Byron et al.
(Continued)

OTHER PUBLICATIONS

International Search Report and Written Opinion issued in International Patent Application Serial No. PCT/2016/036874 dated Sep. 27, 2016, 7 pages.
(Continued)

*Primary Examiner* — Tan V Mai
(74) *Attorney, Agent, or Firm* — Patent Capital Group

(57) ABSTRACT

In a cascaded integrator comb (CIC) filter, a time-varying gain is added before the last integrating stage transforming its sub optimal boxcar impulse response into an FIR filter of arbitrary length. Make the coefficients sparse and taking them from a set of small integers leads to an efficient hardware implementation that does not compromise any of the essential CIC filter characteristics especially the overflow handling. The proposed sparse CIC structure can improve the worst case stop band attenuation by as much as 10 dB while occupying 77% of the chip area and consuming 30% less power compared to a standard a $5^{th}$ order CIC filter, and reducing the overall bit growth of the filter and the amount of high rate operations. Design examples are given illustrating the advantages and flexibility of the proposed structure.

27 Claims, 12 Drawing Sheets

(56) References Cited

U.S. PATENT DOCUMENTS

2007/0189400 A1     8/2007   Nakano et al.
2011/0004647 A1     1/2011   Parida et al.
2013/0332498 A1*   12/2013   Vickers .............. H03H 17/0213
                                                                                      708/300

OTHER PUBLICATIONS

David Lamb et al., "Sparse CIC Filters—A Hardware-Efficient Class of Digital Filters for Decimation and Interpolation", IEEE Transactions on Circuits and Systems II: Express Briefs, Signal Processing Lab, Electronic Systems Eng. Department, University of São Paulo, Brazil, 10 pages.

Vesa Lehtinen et al., "On CIC Decimator Variants—From Shifting Zeros to the Sparse FIR-CIC Structure", Institute of Communications, Tampere University of Technology, Tampere, Finland, 1-4244-0779-6/07 © 2007 IEEE, 4 pages.

Shuni Chu et al., "Multirate Filter Designs Using Comb Filters", IEEE Transactions on Circuits and Systems, vol. CAS-31, No. 11, Nov. 1984, 0098-4094/84/1100-091 © 1984 IEEE, 12 pages.

\* cited by examiner

SPARSE CASCADED-INTEGRATOR-COMB FILTERS

CROSS REFERENCE TO RELATED APPLICATIONS

This application claims the benefit of and priority from U.S. Provisional Patent Application Ser. No. 62/174,688, filed 12 Jun. 2015, entitled "SPARSE CASCADED-INTERGRATOR-COMB FILTERS" which is incorporated herein by reference in its entirety.

TECHNICAL FIELD OF THE DISCLOSURE

The present invention relates to the field of digital signal processing, in particular to sparse cascaded-integrator-comb (CIC) filters used as a hardware-efficient class of digital filters for decimation and interpolation.

BACKGROUND

Cascaded-Integrator-Comb (CIC) filters are ubiquitous in digital signal processing (DSP) applications where efficient interpolation and decimation of oversampled signals is required. Since their introduction the early 1980's, a plethora of research has been dedicated to the improvement of their major weakness: limited worst-case stopband attenuation caused by the fact that all zeros at each stopband null are at the same location instead of being optimally distributed.

Previous approaches have focused on a zero-rotating approach, where structural changes are incorporated to the classical filter with the aim to widen the stopbands by spreading the zeros closer to their optimal location. Another approach is based on a filter sharpening approach, where a sharpening polynomial is applied to the stopbands of the filter. The concepts of polyphase decomposition, multistage factoring and non-recursive implementation of the underlying finite impulse response (FIR) filter have also been applied to the original CIC filter.

CIC filters are simple because the structure is composed solely of integrators and differentiators in a regular arrangement, without the use of external coefficients. The order of the filter is increased until a stated performance is met; there is no coefficient quantization to worry about and overflows can be left undetected. The word-length of all nodes is identical as a direct consequence of the filter order and decimation ratio. The filters are flexible because any integer decimating ratio can be supported with essentially the same hardware, enabling straightforward implementation of programmable decimation ratios, a crucial feature for many systems such as software defined networks (SDN).

Although conventional CIC filters are effective, any performance improvement of the CIC filter has in the past relied on an increase in the filter order R. It would therefore be desirable and advantageous to improve the response of a filter of the aforementioned type without increasing the filter order R, to conserve or reduce area on a chip and power consumption, and more particularly to reduce the computational complexity of a filter of order R without compromising performance.

SUMMARY OF THE INVENTION

According to one aspect of the invention, a sparse cascaded-integrator-comb (CIC) filter includes one or more integrators, each operating on input signal values sampled at a sampling rate corresponding a dock rate fs; a finite impulse response (FIR) filter sequentially receiving at the sampling rate time-varying filter coefficients from a sparse set of filter coefficients; a decimation stage reducing the sampling rate by a predetermined decimation ratio N; and one or more differentiators, each operating at a clock rate fs/N and providing decimated output values. The FIR filter has at its input a multiplier that sequentially multiplies at the sampling rate each of the sequentially received filter coefficients with a corresponding one of the sampled input signals.

According to another aspect of the invention, a method for operating a sparse cascaded-integrator-comb (CIC) filter having a fixed CIC filter and an FIR section with a sparse set of filter coefficients includes the steps of receiving from an output of an integrator sampled signal values at a sampling frequency fs; sequentially multiplying, in the FIR section, at the sampling frequency fs each sampled value with a corresponding filter coefficient taken from the sparse set of filter coefficients; decimating the multiplied sampled signal values by a predetermined decimation ratio and supplying the decimated values to a differentiator to provide decimated output values representing a desired filter response of the sparse CIC filter.

BRIEF DESCRIPTION OF THE DRAWING

To provide a more complete understanding of the present disclosure and features and advantages thereof, reference is made to the following description, taken in conjunction with the accompanying figures, wherein like reference numerals represent similar elements or elements performing similar functions, in which.

DETAILED DESCRIPTION OF EXEMPLARY EMBODIMENTS

To provide a better understanding of the concept of the present invention, reference will first be made to FIG. 1 which illustrates a conventional recursive CIC filter structure composed of a series connection of R integrators, a decimation block 13, and R differentiators. Each integrator includes an adder 12 and a delay unit 11. The input signal n[n] of the integration stage is applied at frequency $f_s$ to one input of the adder 12, and the output signal of the delay unit 11 is fed back to the second input of the adder 12 at each integrator. After the last integration stage, i.e. before the decimation block 13, every $N^{th}$ sample from the output of the last integration stage forward is forwarded to the decimation block 13. After the decimation block 13, R differentiators are connected in series. Each differentiator. Includes a subtractor 16, which performs the inverse function of adder 12, and a delay unit 11. The output of the recursive CIC filter structure of FIG. 1 supplies a signal y[N] with a frequency $f_s/N$, wherein N is the decimation ratio.

Figure 1:
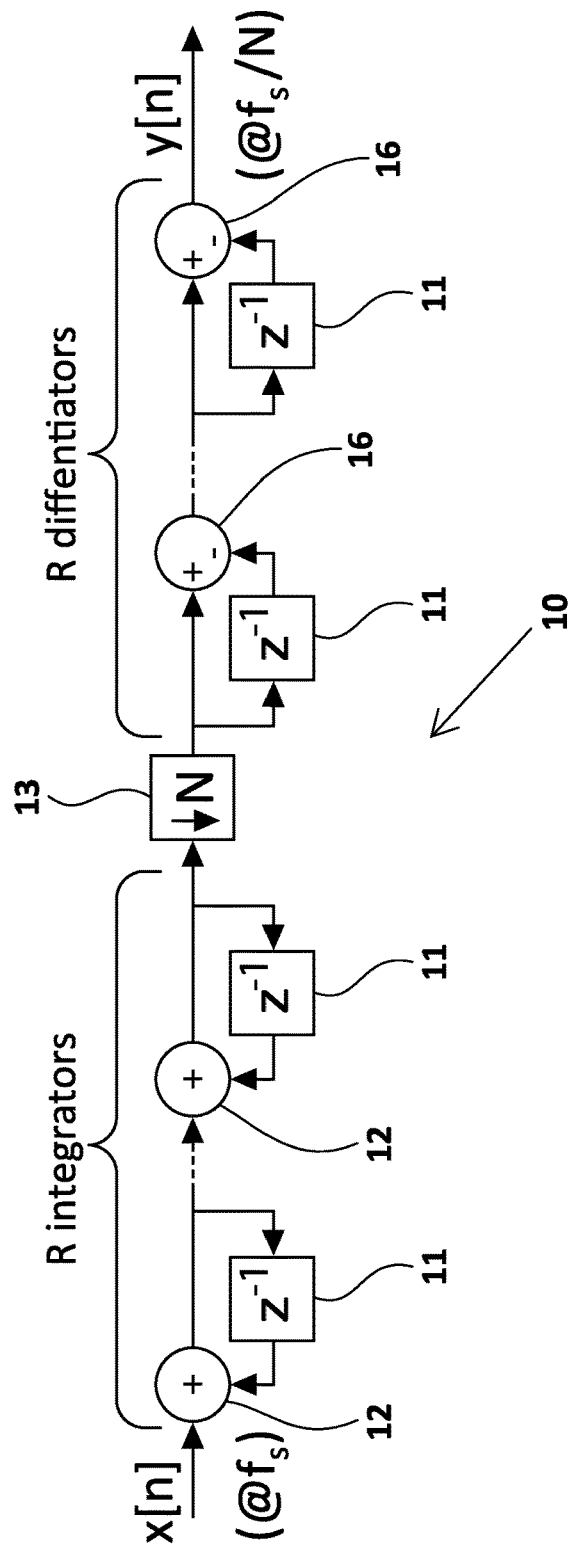
FIG. 1 illustrates a conventional recursive structure for CIC filters.

The recursive CIC filter structure of FIG. 1 can be described by the following transfer function:

$$H(z) = \left(\sum_{i=0}^{N-1} z^{-1}\right)^H = \left(\frac{1-z^{-N}}{1-z^{-1}}\right)^R, \quad (1)$$

where R is the filter order and N is the decimation ratio.

The main particularity of CIC filters is that they exhibit exact pole-zero cancellation, such that the recursive structure is implementing exactly the underlying FIR filter on the left side of eq. (1). The impulse response of an $R^{th}$ order CIC filter is that of the convolution of R boxcar filters of length N; each CIC integrator/differentiator pair is responsible for generating each such boxcar impulse response. To ensure stability, the wordlength of all nodes should be made equal to $B_{in}+B_{growth}$, where $B_{in}$ is the input wordlength and $B_{growth}=[R \log_2(N)]$ representing the growth of output bits (output wordlength) compared to the input wordlength. An overflow in an internal node will not affect the output as long as the correct wordlength is used with two's complement arithmetic.

The CIC filter is not an aggressive filter, but is extremely well suited to decimation or interpolation of oversampled signals. In the following discussion, without loss of generality, decimating oversampled signals will be used as an illustrative example. It has been shown that decimation is optimally performed in multiple stages wherein the filter order of the initial stages can be substantially reduced. Multistage partitioning is possible as long as the oversampling ratio, osr, can be expressed as a product of integers, i.e. osr=N·M. CIC filters, which are relatively inexpensive filters to implement, play the role of the first stage filter (#N) and are designed to decimate the signal as much as possible, while providing enough antialiasing attenuation for the frequency bands that will alias into the baseband. For a sampling rate of $f_s$, the baseband or passband range $w_p$ is defined as the frequency range:

$$w_p = \left[0, \frac{fs/2}{osr}\right], \quad (2a)$$

and the aliasing bands, or stopbands, are given by:

$$w_s = \bigcup_{n=1}^{N/2} \left[\frac{fs}{2}\left(\frac{2n}{N} - \frac{1}{osr}\right), \frac{fs}{2}\left(\frac{2n}{N} + \frac{1}{osr}\right)\right], \quad (2b)$$

and $A_{min}$, the worst case attenuation in the stopbands, is given by $$A_{min} = \max_{w \in w_s} |H(w)|. \quad (2c)$$

Figure 2:
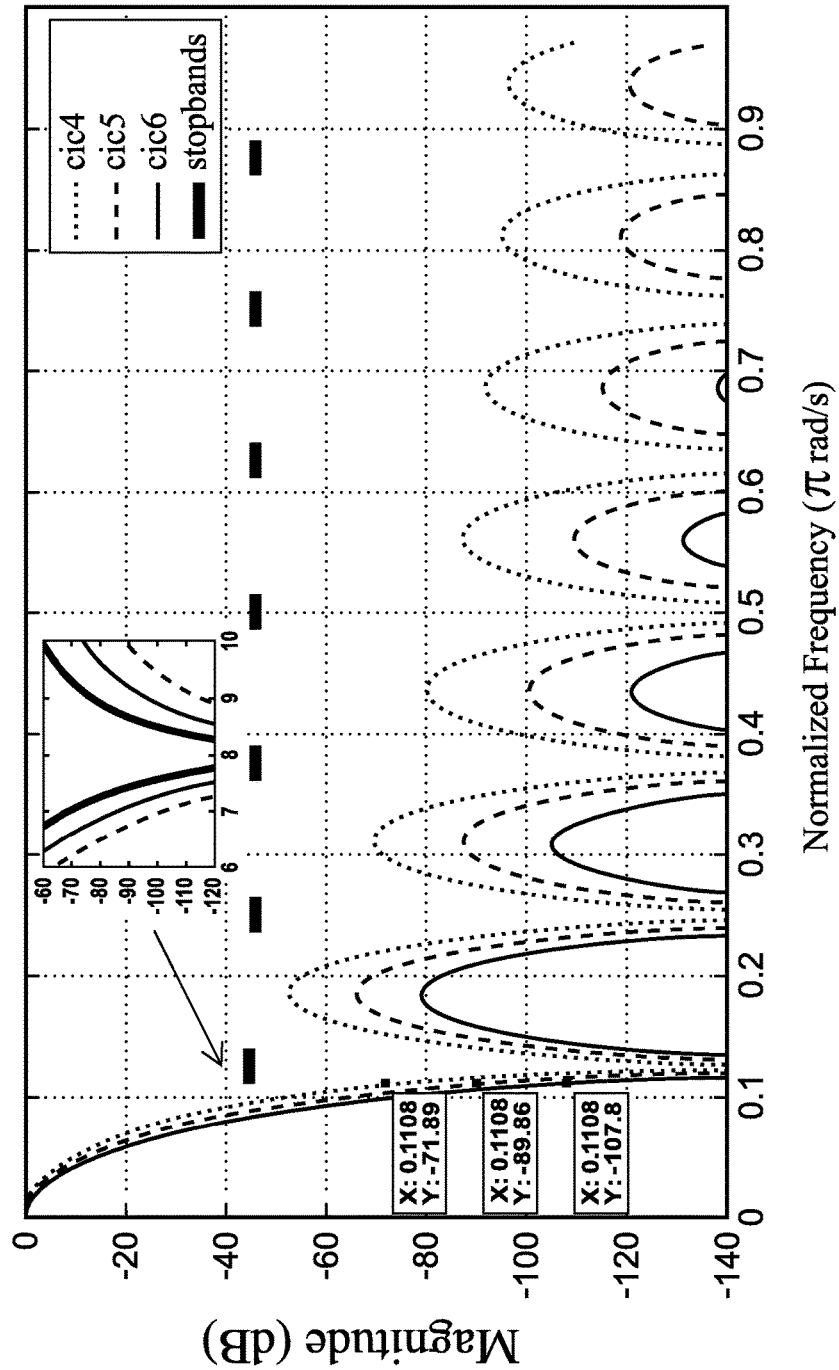
FIG. 2 illustrates an exemplary response of conventional CIC filters of order 4, 5, and 6.

FIG. 2 shows an exemplary response of conventional response of $4^{th}$, $5^{th}$ and $6^{th}$ order CIC filters with corresponding $A_{min}$, along with a zoomed section of the first null, assuming a passband $f_p=\alpha^* f_s/(2^*osr)$, where for illustrative purposes $\alpha=0.907$. This value of $\alpha$ is a reasonable assumption and corresponds for an output sampling rate of osr=64 to standard oversampled audio signal with $f_s/osr=44.1$ kHz, resulting in a passband edge at 20 kHz. The exemplary embodiments of filter configurations discussed later in the specification will use these same values.

As seen in FIG. 2, the bottleneck of the frequency response is located at the first aliasing edge of the first null. Increasing the order to R+1 in eq. (1) adds N extra zeros across the unit circle at exactly the same frequency points as the filter of order R, which is not optimal for improving stopband attenuation.

Previous approaches for optimizing the location of the zeros across the unit circle by shifting some of the extra attenuation at the higher-frequency aliasing bands include polyphase implementation, sharpening CIC filters, and zero rotation, which operate as follows:

In a polyphase implementation, the transfer function of the CIC filter is expressed directly as that of an FIR filter, either in a single stage or in multiple stages, allowing free selection of the coefficients. However, this approach typically breaks down when the input has more than 1 or 2 bits and, for multistage decomposition, when a programmable ratio cannot be expressed as a product of integers, which is quite common.

With sharpening CIC filters, a sharpening polynomial can be applied to the stopbands of a CIC filter or passband droop can be reduced, or both. Since the sharpening polynomials can be quite different for different decimation ratios N, the use of hardware for programmable filters is inefficient.

With zero rotation, the filter obtained by rotating the zeros of CIC filters directly in the recursive structure requires a prohibitively high number of bits for implementing the coefficients in a stable way.

Figure 3:
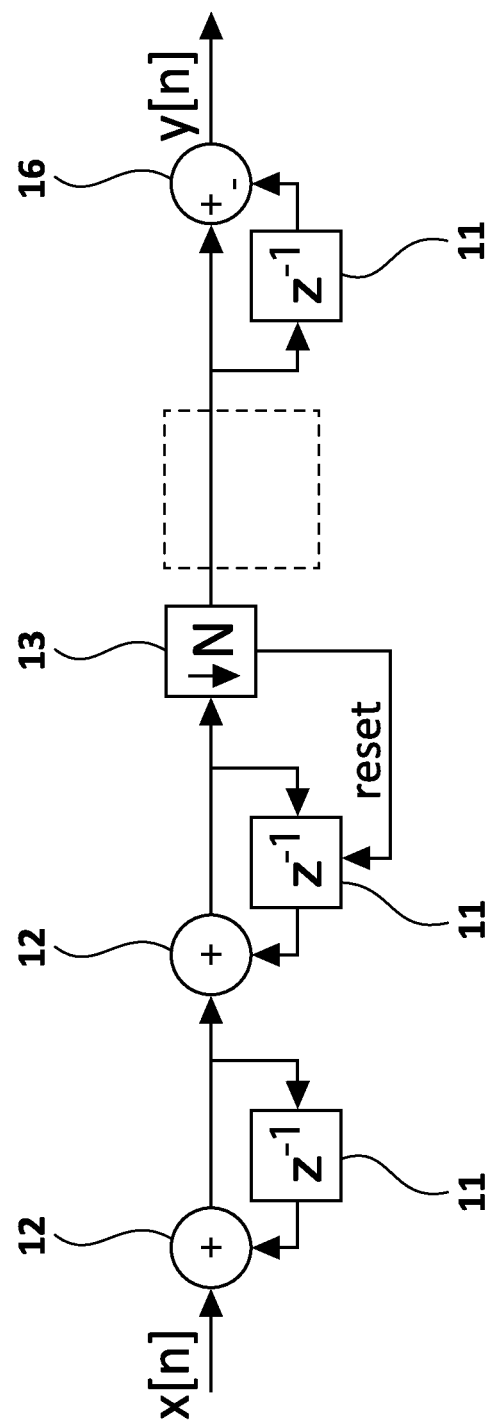
FIG. 3 illustrates the conventional CIC filter of FIG. 1 with the first differentiator removed and replaced with an integrate&dump circuit.

FIG. 3 shows a filter structure similar to the conventional CIC filter of FIG. 1 wherein the innermost integrator/differentiator pair of CIC filters, in the depicted example a $2^{nd}$ order filter, is replaced with an integrate&dump (int&dump) circuit. This embodiment takes advantage of the fact that the first differentiator of CIC filters is redundant because it simply removes the initial condition at the preceding integrator N cycles prior: the integrator output at time N is the running sum of the input plus the initial condition, and the differentiator simply removes the initial condition. The reset operation of the integrator has virtually no hardware cost, so this optimization saves roughly ½R the area of the corresponding CIC filter.

Each section of a CIC filter may have an N-tap FIR filter with coefficients equal to one. The diagram of FIG. 3 can thus be redrawn in the form shown in FIG. 4, where all the h[n] coefficients are equal to 1. Those two circuits are equivalent, and the int&dump version is simply a hardware-efficient way to implement the FIR filter. This observation leads to a key aspect of the present invention, namely to modify the CIC filter of FIG. 3 to allow different sets of coefficients for the last section by using a time-varying coefficient at the input of the last integrator. The low complexity of the CIC filter can be retained by restricting this time-varying coefficient to be "simple" (i.e. 0 or 1, or a small integer smaller than 3 or 4).

Figure 4:
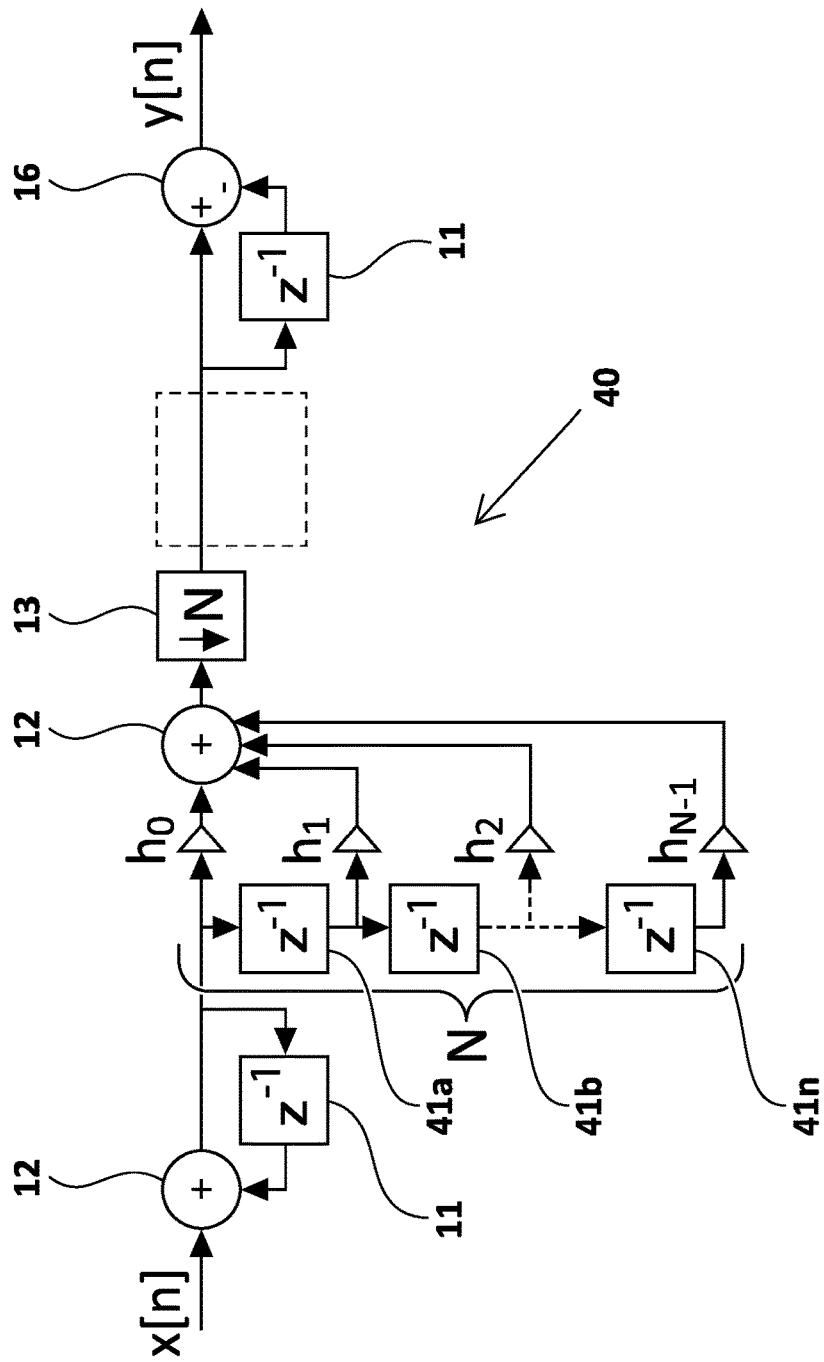
FIG. 4 shows a conventional FIR implementation of the last integrator of a CIC filter.
Figure 5:
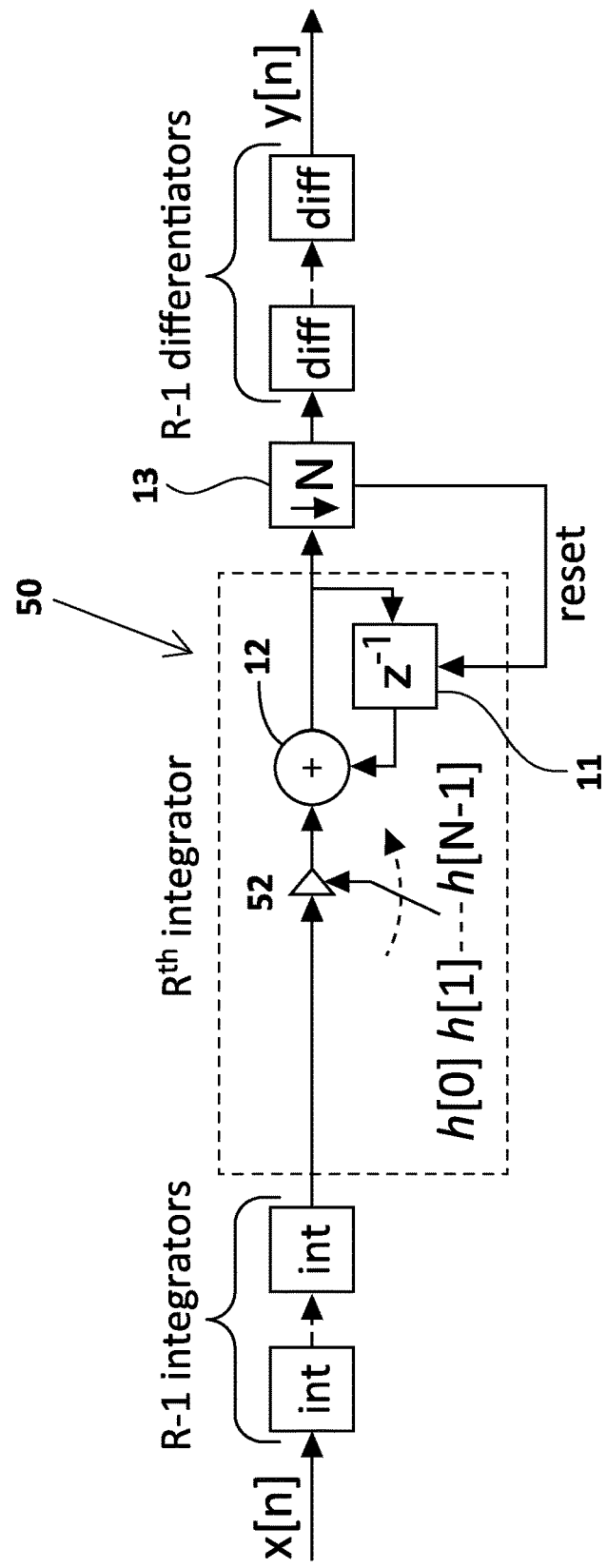
FIG. 5 shows a sparse CIC filter structure, with the h[n] coefficients controlled by a time-varying multiplier, according to an embodiment of the present invention.

According to one embodiment of the present invention shown in FIG. 5, The $R^{th}$ integrator 50 may apply the N separate h[n] coefficients by using a time-varying multiplier 52 upstream of the adder 12, instead of supplying and processing N separate coefficients h[n] in the essentially parallel structure of FIG. 4 which even for modest decimation ratios N would disadvantageously require a large number of storage elements. Having full control over the coefficients of the last stage of a CIC filter can advantageously improve the frequency response. The proposed structure according to the present invention depicted in FIG. 5 retains the conventional int&dump circuit of FIG. 3, but precedes it with a time-varying multiplier 52 which multiplies the input at the sampling frequency $f_s$ sequentially with N separate coefficients h[n], h[1] ... h[N-1], thus providing full control over the h[n] coefficients. The set of coefficients {h[n]} may also be identical to or greater than the decimation ratio N, as will be described later.

The transfer function of an $R^{th}$ order sparse CIC filter is given by $$H_{spCIC}^{(R)}(z) = \left(\frac{1-z^{-N}}{1-z^{-1}}\right)^{R-1} * \left(\sum_{n=0}^{N-1} h_n z^{-n}\right) \quad (3)$$

where the coefficients $h_n$ are free parameters to be designed. Note that the FIR filter is still implemented efficiently by using an integrator, but now has a time-varying input gain. In simple terms, for a system with a total of R integrators, the response of an $(R-1)^{th}$ order CIC filter is convolved with the response of an N-tap FIR filter which can be fully controlled.

One problem with placing the zeros at or near their optimal locations is that this approach requires precise coefficients. As mentioned earlier, these required precise coefficients disadvantageously have a relatively large dynamic range, thus increasing the number of bits (or wordlength) at the output. All the bits have to be kept since the FIR has to work with the same modulo arithmetic as the CIC filter, thus increasing the wordlength of all nodes of the filter and undermining most of the advantages of the CIC filter. However, as will be described below, the response of the FIR filter can be improved even with suboptimal coefficients which are selected so keep the hardware simple. These suboptimal FIR coefficients may be constrained to a set of small integers, ideally as sparse as possible, since a coefficient equal to zero means "do not integrate", thus reducing the amount of high speed operations performed by the filter and the overall filter gain as well as reducing the number of bits required for all the nodes of the filter. It should be kept in mind that the goal here is to design an FIR filter that provides sufficient attenuation at the first stopband useful for practical applications, and not necessarily a perfect notch with infinite attenuation, while simultaneous reducing circuit size, circuit complexity and power demand.

The proposed structure can thus be thought of as a hybrid recursive/polyphase approach to CIC filters. The recursive part places zeros in the middle of the aliasing bands at reasonable, albeit not optimal locations. Conversely, the polyphase part gives full control of its zero locations, albeit at the cost of increased coefficient complexity. As will be described below, once enough recursive sections are used, better performance may be achieved by using a sparse polyphase FIR with trivial coefficients. The significant advantage here is the use of a time-varying multiplier in front of the int&dump circuit which keeps the memory requirements of the polyphase filter to a minimum.

According to one embodiment of the present invention, an FIR filter with sparse coefficients can be designed, wherein the sparse coefficients are taken from a subset of small integers that would complement the response of the CIC filter in a better way than a conventional boxcar filter. This filter design can be implemented on most modern computers by using Mixed-Integer Linear Programming (MILP) solvers. MILP solvers do not require knowledge of the inner working of the algorithms. The following description illustrates how these MILP solvers can be used to design hardware-efficient modified CIC filters, using appropriate constraints on the coefficients.

The zero-phase frequency response of a length-N FIR filter can be written as $$H(\omega) = \sum_{n=0}^{M} b(n)\Phi(\omega, n) \quad (4a)$$

where $$\Phi(\omega, n) = \begin{cases} 1 & \text{for Type I; } n = 0 \\ 2\cos(n\omega) & \text{for Type I; } n > 0 \\ 2\cos\left[\left(n+\frac{1}{2}\right)\omega\right] & \text{for Type II} \\ 2\sin[(n+1)\omega] & \text{for Type III} \\ 2\sin\left[\left(n+\frac{1}{2}\right)\omega\right] & \text{for Type IV} \end{cases} \quad (4b)$$

$$b(n) = \begin{cases} h\left[\frac{N-1}{2}-n\right] & \text{for Type I} \\ h\left[\frac{N-2}{2}-n\right] & \text{for Type II and IV} \\ h\left[\frac{N-1}{2}-n\right] & \text{for Type I} \end{cases} \quad (4c)$$

$$M = \begin{cases} \frac{N-1}{2} & \text{for Type I} \\ \frac{N-2}{2} & \text{for Type II and IV} \\ \frac{N-3}{2} & \text{for Type III} \end{cases} \quad (4d)$$

where h[n] are the coefficients of the filter. In MILP, the coefficients b[n] that minimize $$\delta_1 = \max_{\omega \in W_s} |H_{prop}(\omega) - D(\omega)| \quad (5a)$$

subject to $$\max_{\omega \in W_p} |H_{prop}(\omega) - D(\omega)| < \delta_2 \quad (5b)$$

and $$b[n] \in B, \quad (5c)$$

where $\omega_p$ and $\omega_s$ are passband and stopband regions, respectively, as in eq. (2a) and (2b); $\delta_2$ is the maximum allowable passband droop, and $D(\omega)$ is the ideal response, in this case "1" in the passband and "0" in the stopband. The coefficients b[n] are taken from a subset of the integers $B \subset Z$, wherein B can be [0, 1] in many cases. Since $H_{spCIC}^{(R)}(z)$ in eq. (3) represents the cascade of a fixed CIC filter and the FIR filter to be designed, the CIC filter response can be pre-calculated and used as a weighting function, thereby reducing the number of variables to optimize for the FIR filter. This is only one exemplary design option for obtaining a suitable attenuation at the stopband. Other cost functions may be used for desirable passband droop and stopband attenuation, such as minimizing the number of non-zero coefficients.

Figure 6:
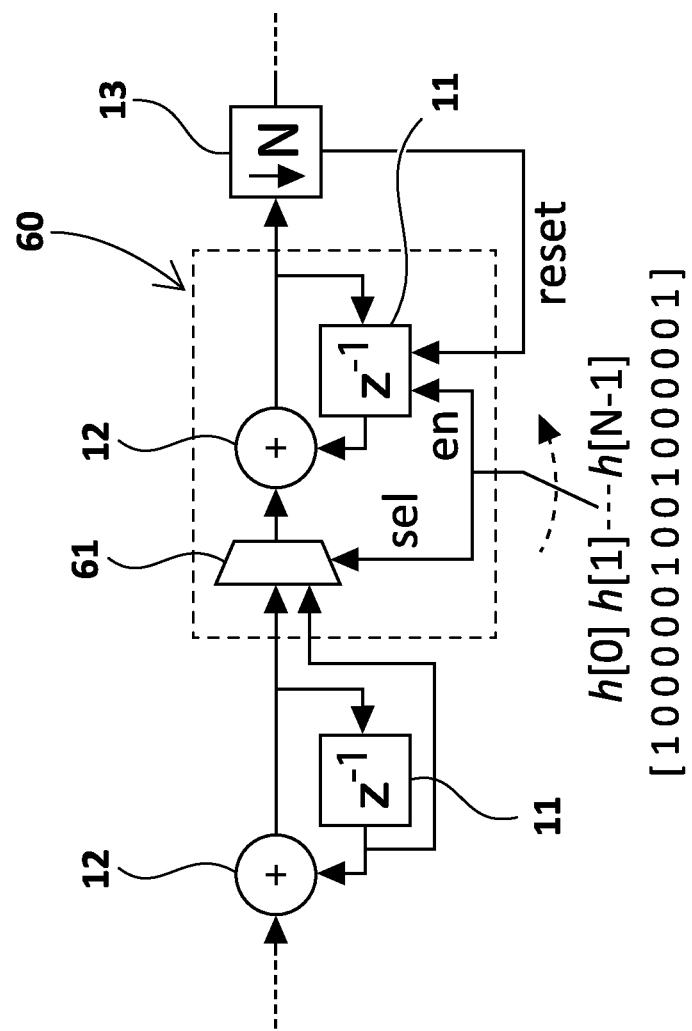
FIG. 6 illustrates an efficient low-power implementation of the integrator with time-varying coefficients $h_n \in \{0,1\}$ according to an embodiment of the present invention.

FIG. 6 shows an efficient implementation of the int&dump circuit with time varying coefficients h[0], h[1] . . . h[N−1], as indicated by the dashed arrow. In the illustrated example, the time-varying coefficients are restricted to 0 and 1, i.e. to the exemplary set of 16 bits [1000010010000001]. When h[n]=0, the flip-flop 61 is disabled or clock-gated and the adder 12 is also data gated—i.e. presented with the same two input values as in the previous cycle, thus avoiding unnecessary calculations. A proper multiplier (or more appropriately a shift&add network) can be designed as part of the multiplexer logic, if h[n] can assume values other than 0 or 1.

Figure 7:
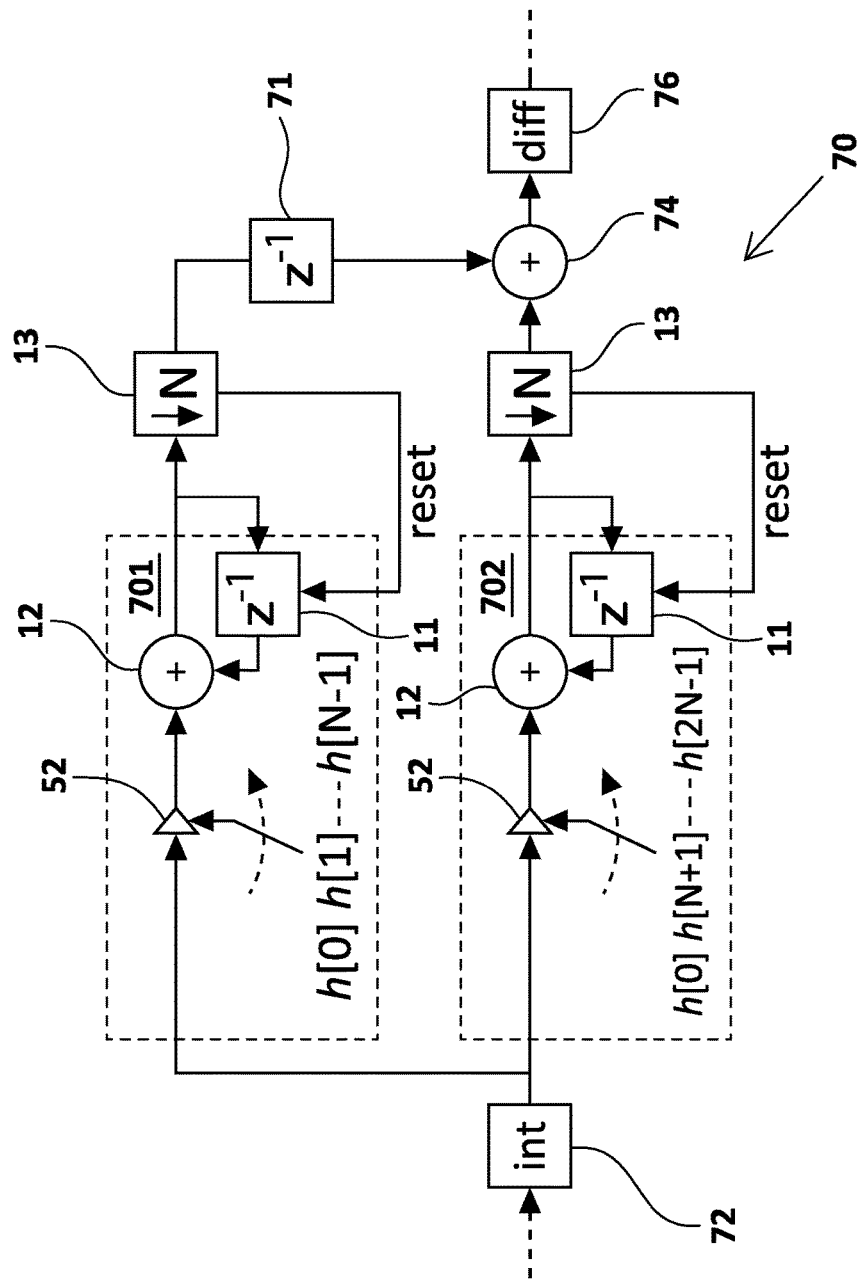
FIG. 7 illustrates implementation of FIR filter with more than N taps according to an embodiment of the present invention.

According to another embodiment of the present invention depicted in FIG. 7, the FIR filter may not be restricted to a length of N equal to the decimation ratio N, but may have a longer impulse responses (>N) while only adding marginally to hardware complexity and requiring only a small number of additional memory elements. The overall FIR filter 70 is here composed of two identical FIR filters 701, 702, each receiving the output from the last CIC integrator 72. Because each FIR filter 701, 702 is directly followed by the respective decimation block 13, only every other of the N outputs is added in adder 74 and used by the chain of differentiators 76. As further shown in FIG. 7, each of the exemplary FIRs 701, 702 is implemented using the time-varying multiplier 52 according to the present invention. The added cost for each increase of N taps of the FIR filter is one integrator at the high sampling rate ($f_s$) using the new set of h[n], one memory element or delay unit 71 at the low rate ($f_s/N$) delaying the integrator result by one output cycle, and one adder 74 at the low rate. The hardware cost is identical as if the CIC filter order were increased by 1 (one integrator and one differentiator). In practice, the real cost will depend on the performance improvement that a longer FIR can provide, the choice of coefficient set constraints, and the overall gain of the filter, with different designs requiring optimization of different parameters.

Figure 8:
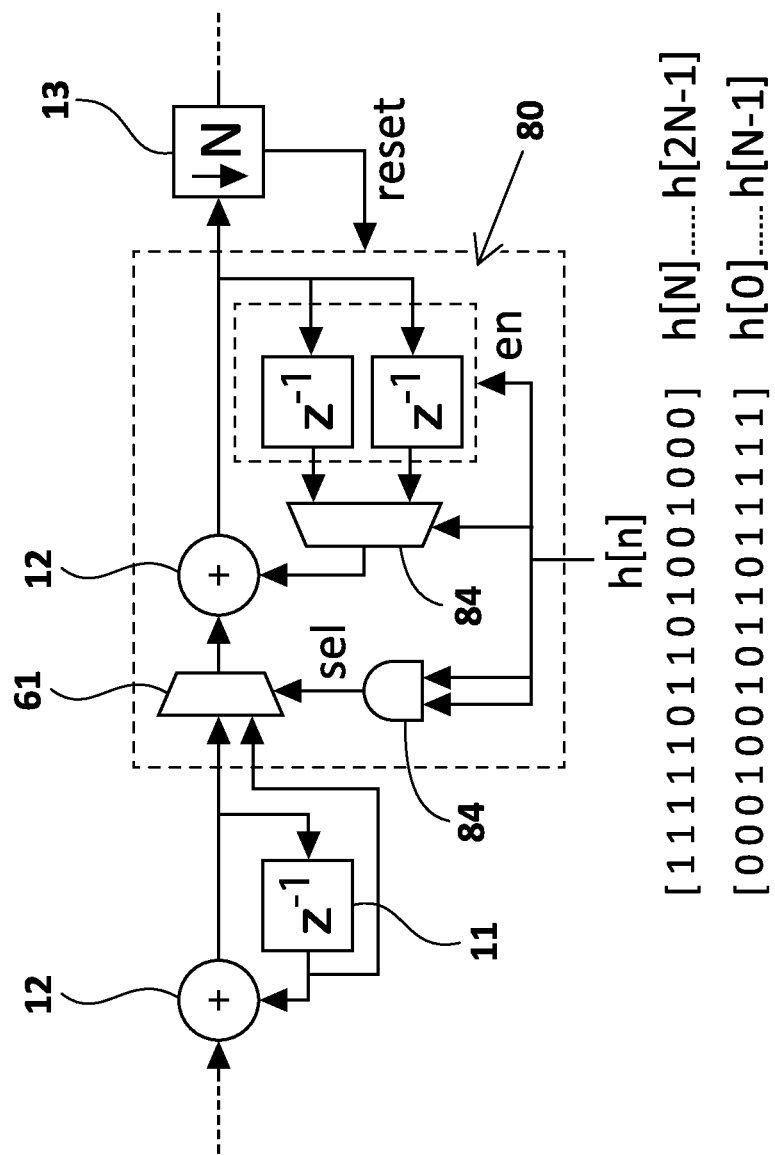
FIG. 8 illustrates sharing of integrator and adder, according to according to an embodiment of the present invention.

In one embodiment according to the present invention shown in FIG. 8, the FIR filter 80 may be designed so that two non-zero coefficients for each integrator are never active at the same time. This constraint can be expressed as $$h[n]+h[n+N] \leq 1, \text{ for } n \in [0, N-1]. \quad (6)$$

Flip-flops 84 control the flow of the two sets of coefficients. The functionally of the filter is otherwise identical to that of the filter of FIG. 7, but conserves chip area due to the reduced number of circuit elements.

In another unillustrated embodiment according to the present invention, the FIR filter length may be extended to N+1, with h[N+1]=0; the extra integrator path reduces to a simple delay (or a gain and a delay if h[N+1]≠1). This structure gives full control of all the coefficients for any length FIR by using an integrator with time-varying coefficients.

Figure 9:
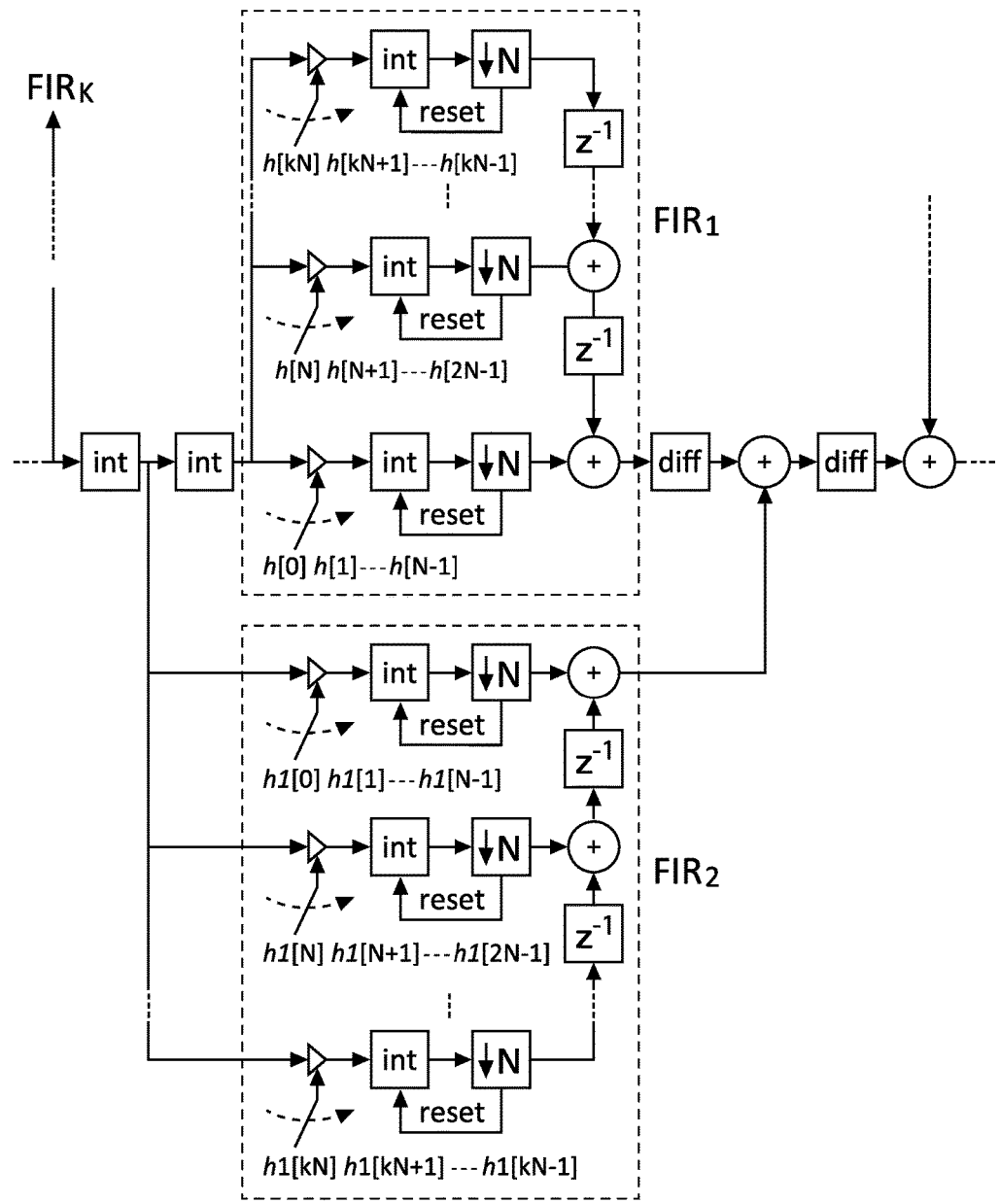
FIG. 9 shows an exemplary embodiment according to an embodiment of the present invention where an embedded FIR filter with time-varying coefficients is applied to all integrators of a CIC filter.

FIG. 9 shows another exemplary embodiment of the present invention, wherein an embedded FIR filter with time-varying coefficients (indicated by the curved dashed arrows) is applied to all integrators of a CIC filter, with the output of each FIR added back to the appropriate differentiator (see offset between the taps of $FIR_1$ and $FIR_2$). In this structure, a branch originates from each integrator as opposed to every second one, and there is a fully controllable polyphase FIR filter of any length for each branch. Such a structure may be an extremely efficient general purpose FIR filter structure, leveraging the unique property of integrators to generate integer coefficients economically, with added control provided by using simple multipliers with time-varying coefficients.

Figure 10:
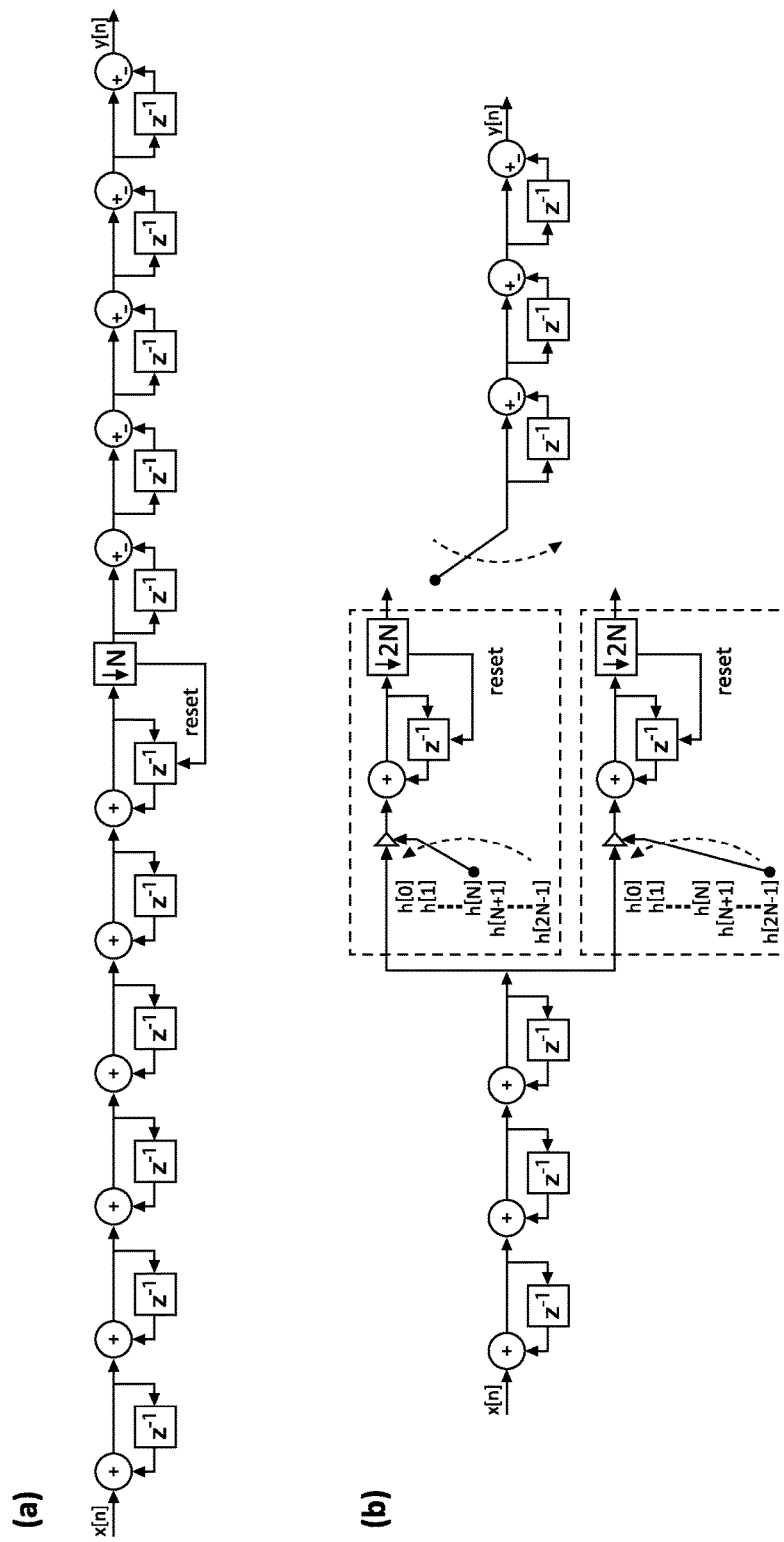
FIG. 10 illustrates a comparison between a $6^{th}$ order standard CIC filter and a $3^{rd}$ order sparse CIC filter with a length 2N.
Figure 11:
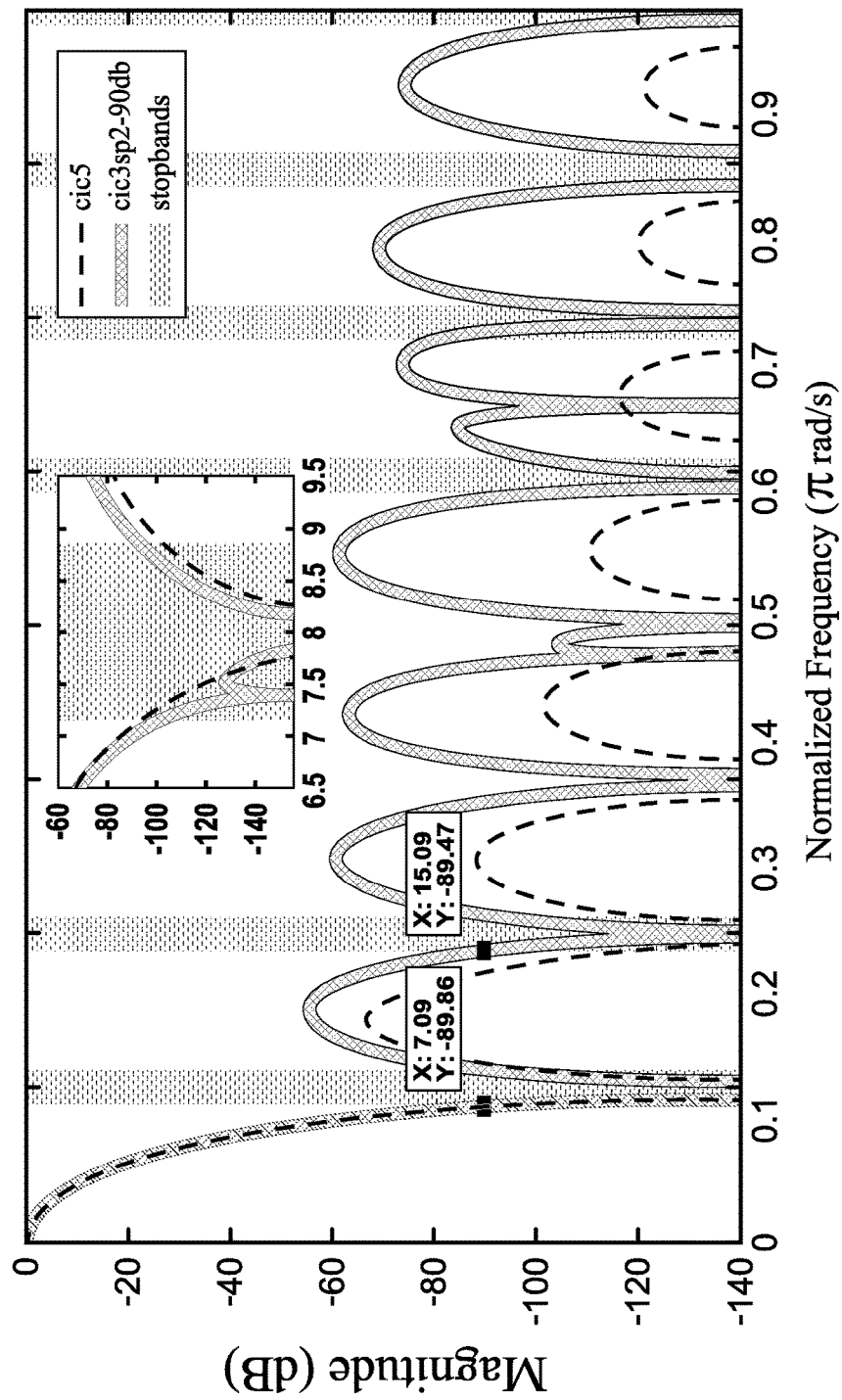
FIG. 11 illustrates frequency response of the $3^{rd}$ order sparse CIC filter of FIG. 10 with a standard $5^{th}$ order CIC filter with a minimum number of non-zero coefficients h[n] for $A_{min} \sim 90$ dB in the first stopband.

FIG. 10 shows in the upper section (a) of the Figure a $6^{th}$ order standard CIC filter of the type previously shown in FIG. 1. This filter has 5 integrators, not counting the innermost integrator next to the decimator. The following three types of filters have a total of 5 integrators, and these will now be compared based on the numbers listed in Table I: the standard $5^{th}$ order cic5, the previously presented cic4sp1, and a $3^{rd}$ order sparse CIC with an FIR of length 2N, denoted cic3sp2 and shown in the lower section (b) of FIG. 10. Coefficients of the cic3sp2 filter were constrained to the set 0, ±1, ±2. The frequency responses of the cic5 filter and the cic3sp2 filter providing an $A_{min}$ of at least −90 dB are shown in FIG. 11. The coefficients of cic3sp2 filter are [1-11001001101102002011011001001-11].

Table I summarizes the performance and computational complexity of several CIC filters implemented with and without sparse CIC filters.

TABLE I

| | N | $A_{min}$ | $B_{growth}$ | Area (μm²) | Power (mW) |
|---|---|---|---|---|---|
| cic5 | 16 | −89.8 | 20 | 27,930 | 0.110 |
| cic6 | 16 | −107.8 | 24 | 39,026 | 0.155 |
| cic4sp1 | 16 | −100.1 | 18 | 25,899 | 0.092 |
| cic5sp1 | 16 | −120.1 | 22 | 36,770 | 0.131 |
| cic4sp1 {−4 . . . +4} | 16 | −107.9 | 17 | 27,798 | 0.1279 |
| cic5sp1 {−4 . . . +4} | 16 | −134.4 | 21 | 39,044 | 0.1822 |
| cic3sp2 | 16 | −108.1 | 16 | 23,750 | 0.101 |
| cic3sp2 ($A_{min} \approx$ −90 dB) | 16 | −89.87 | 14 | 21,603 | 0.078 |

The $3^{rd}$ order sparse CIC filter cic3sp2 with an FIR of length 2N has a performance similar to the 6 h order standard CIC filter ($A_{min} \approx$ −107 dB). $B_{growth}$ is 24 bits for the cic6, 20 bits for the cic5, and merely 16 bits for the sparse cic3sp2 (FIG. 13b). The benefits of using a length-2N FIR (i.e. extra sparse integrators) as opposed to adding standard CIC stages are clearly illustrated: not only is the performance increased, but the number of bits to do so is reduced, thanks to the sparsity of the FIR filter. Extra sparse integrators also do not require a differentiator, increasing area savings. The area taken up on a chip and the power consumption for the cic5 and cic3sp213, respectively, are 39,002 μm² and 0.155 mW for the standard $6^{th}$ order CIC6, compared to 23,750 μm² and 0.101 mW for the $3^{rd}$ order sparse cic3sp2 with length-2N FIR, representing savings of about to 40% in both metrics.

Sparse CIC filters of the orders 4, 5 and 6 were designed, constraining the coefficients to the set {0, 1}). The results for CIC4 are not listed in Table I. The optimal FIR filter coefficients, h[n], are identical for all three filters and given by {$h_n$}=[1000001001000001], which has a high level of sparsity. Performance results are shown in FIG. 11, along with a zoomed section of the first null, showing the effective zero rotation provided by the h[n]. The filter specifications were N=16, osr=64, α=0.907, with a worst case attenuation of −90 dB across all stopbands. Values of [$A_{min}$; $B_{growth}$]= [−77.6 dB, 14 bits], [−100.1 dB, 18 bits] and [−120.1 dB, 22 bits] were obtained for the three sparse filters. Compared to standard CIR filters without a sparse FIR filter, which have [$A_{min}$; $B_{growth}$]=[−71.8 dB, 16 bits], [−89.8 dB, 20 bits] and [−107.8 dB, 24 bits], respectively, for standard CIC filters of order 4; 5 and 6, $A_{min}$ of the sparse filters is reduced by around 6, 11, and 13 dB for each respective filter, while $B_{growth}$ of all filters is reduced by 2 bits. A $6^{th}$ order conventional CIC filter is thus required to satisfy Amin=−90 dB, since a $5^{th}$ order filter still falls short by −0.2 dB (first row of Table I). Conversely, a $4^{th}$ order sparse CIC filter ($3^{rd}$ row of Table I) with $A_{min}$=−100 dB is more than adequate to satisfy $A_{min}$=−90 dB.

Since $B_{growth}$ represents the wordlength of all nodes in the filter, substantial area savings are achieved. Moreover, the sparse CIC filter has a total of 9 memory elements and 9 adders, whereas the conventional CIC design requires 3 extra storage locations and 2 extra adders, as well as 2 extra bits to account for bit growth. Furthermore, the performance is increased due to the decreased number of operations (a sparse filter has many zeros, requiring no operations at all), while using the same hardware structure.

As mentioned before, the FIR coefficients need not be constrained to the subset {0, 1}. Better performance can be achieved when this constraint is relaxed, such as constraining the coefficients to integers in the set {−4, +4}. Improvements of 5, 7, and 14 dB are possible compared to the same filters constrained to using binary coefficients, while $B_{growth}$ is reduced by 1 bit. Only for the 5th order filter was a coefficient ±3 used, costing an extra adder, while the set {0, ±1, ±2, ±4} is optimal for the other two filters, implementable with a trivial multiplexer, sign change and a shift.

It will be understood that the coefficients may not be restricted to any of the above-referenced sets of coefficients, but may be constrained to any suitable number, for example {−12, +12} or the like, that produce the desired attenuation at the first stopband.

Figure 12:
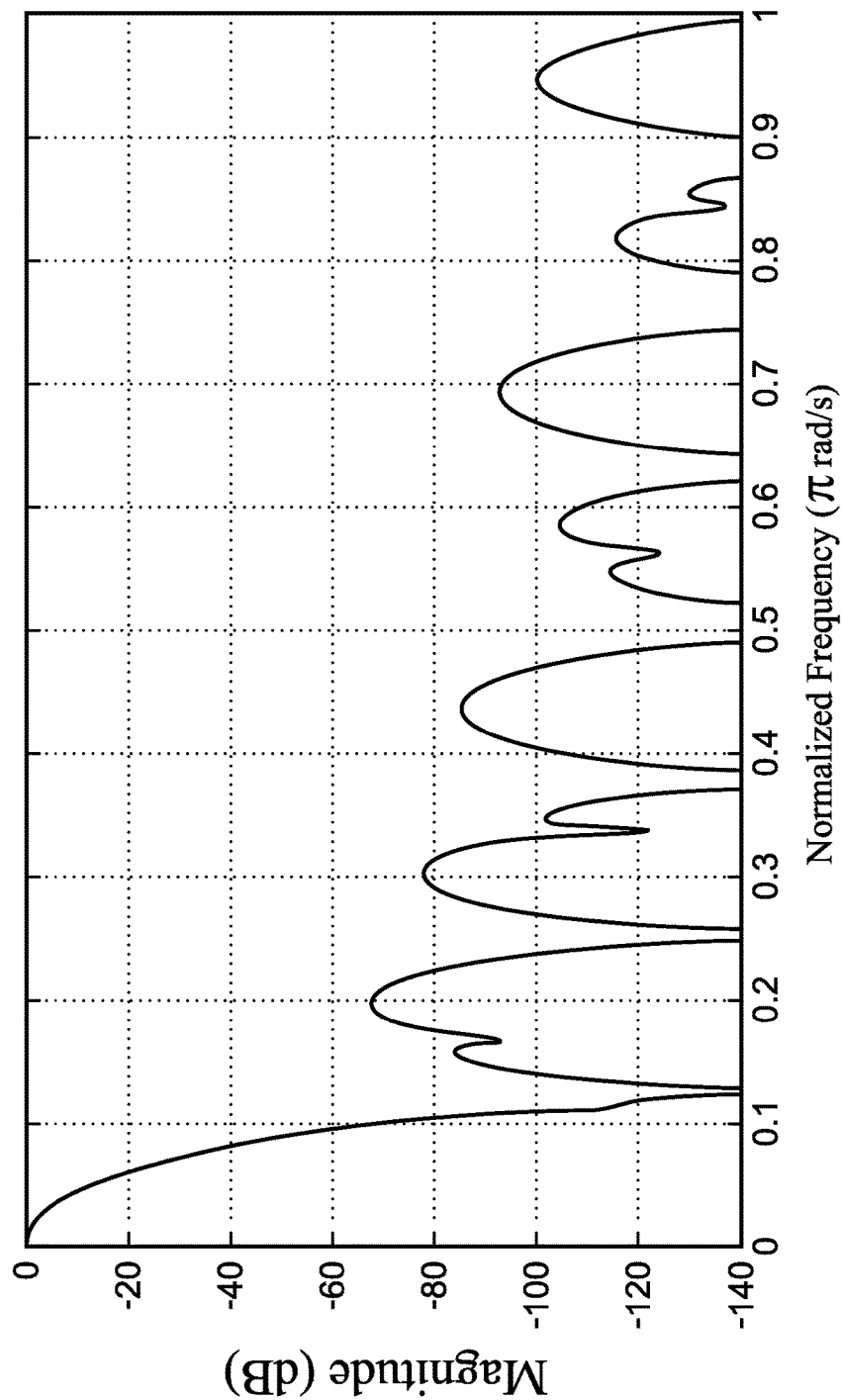
FIG. 12 depicts a simulated frequency response of the $3^{rd}$ order sparse CIC filter of FIG. 10(b).

FIG. 12 shows an example of a simulated frequency response sweep test for a sparse $5^{th}$ order CIC filter having the properties listed in the $4^{th}$ row of Table I. A complete cycle and bit-accurate fixed-point model of the proposed structure was built and all of the designed filter examples were tested with various types of input signals such as sine waves, square waves, full scale DC inputs, and the response was compared with that of the underlying FIR filter predicted by the transfer function. Each point of the simulated response line is calculated by measuring the signal level of a sinusoidal tone after being filtered by the model, accounting for aliasing, and adjusting for gain. 1024 such simulations were run to generate this curve.

In certain contexts, the sparse CIC filters described herein may be applicable to medical systems, scientific instrumentation, wireless and wired communications, radar, industrial process control, audio and video equipment, current sensing, instrumentation (which can be highly precise), and other digital-processing-based systems.

In yet other contexts, the teachings of the present disclosure may be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

It should be noted that all of the specifications, dimensions, and relationships outlined herein (e.g., the number of processors, logic operations, etc.) have only been offered for purposes of example and teaching. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It should also be noted that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Furthermore, "a" or "an" in the specification and the claims may refer a single item and/or feature or to more than one item and/or feature.

It should also be noted that the functions related to sparse CIC filters, illustrate only some of the possible functions that may be executed by, or within, systems illustrated in the Figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the apparatus described above may also be implemented with respect to the method or process described herein and specifics in the examples may be used anywhere in one or more embodiments.

What is claimed is:

1. An efficient low-power cascaded-integrator-comb (CIC) filter comprising:
 a series of integrating stages comprising a last integrating stage in the series of integrating stages operating on signal values from previous integrating stages, wherein the last integrating stage comprises:
  an integrator having an adder and a delay unit whose output is fed back to the adder; and
  a multiplier, upstream of the adder, to implement time-varying input gain, sequentially receive time-varying coefficients, and multiply each of the time-varying coefficients with corresponding one of the signal values received from previous integrating stages, wherein the time-varying coefficients includes at least one zero;
 a decimation stage to decimate an output of the integrator; and
 a differentiator downstream from the decimation stage.

2. The efficient low-power CIC filter of claim 1, wherein the time-varying coefficients comprise a set of coefficients being cycled over time.

3. The efficient low-power CIC filter of claim 1, wherein:
 the multiplier comprises a flip-flop; and
 when the time-varying coefficient is zero for a given cycle, the flip-flop is disabled and the adder is data-gated with a same input value as a previous cycle to avoid unnecessary calculations.

4. The efficient low-power CIC filter of claim 3, further comprising:
 a further integrator having a further adder and a further delay unit whose output is fed back to the further adder; and
 a further multiplier upstream of the further adder to implement time-varying input gain, and sequentially receive a further set of time-varying coefficients, and multiply each of the further time-varying coefficients with corresponding one of the signal values received from the previous integrating stages, wherein the further time-varying coefficients includes at least one zero; and
 a further decimation stage to decimate an output of the further integrator;
 an output delay unit to delay an output of the further decimation stage; and
 an output adder upstream of the differentiator to add an output of the decimation stage and an output of the output delay unit.

5. The efficient low-power CIC filter of claim 1, wherein the time-varying coefficients have values restricted to 0 and 1.

6. The efficient low-power CIC filter of claim 1, wherein the time-varying coefficients have values restricted between −4 and +4.

7. The efficient low-power CIC filter of claim 1, further comprising:
 a further delay unit in parallel with the delay unit in the last integrating stage; and
 flip-flops in the last integrating stage to control flow of the time-varying coefficients and further time-varying coefficients being applied in the last integrating stage.

8. The efficient low-power CIC filter of claim 7, wherein the time-varying coefficients and the further time-varying coefficients do not have non-zero coefficients at a same cycle.

9. The efficient low-power CIC filter of claim 1, wherein the last integrating stage, the decimation stage, and the differentiator form a finite impulse response (FIR) filter with a predefined frequency response and the time-varying coefficients are calculated by taking into account the predefined frequency response of the FIR filter.

10. A method for operating a cascaded-integrator-comb (CIC) filter with low memory requirements, comprising:
 receiving input values by a last integrating stage of the CIC filter from an output of previous integrating stages;
 sequentially multiplying, at an input of an integrator in the last integrating stage each input value with a corresponding coefficient in a set of coefficients, wherein the set of coefficients are restricted to values between −4 and +4; and
 decimating an output of the integrator in the last integrating stage and supplying decimated values to a differentiator of the CIC filter.

11. The method of claim 10, wherein sequentially multiplying a given input value with coefficient having a value of zero at a given cycle comprises clock-gating a flip-flop at an input of the integrator in the last integrating stage.

12. The method of claim 10, sequentially multiplying a given input value with coefficient having a value of zero at a given cycle comprises data-gating an adder of the integrator in the last integrating stage at the given cycle.

13. The method of claim 10, wherein the set of coefficients have are restricted to values between −1 and +1.

14. The method of claim 10, wherein the set of coefficients have values restricted have at least one zero.

15. The method of claim 10, further comprising and calculating the set of coefficients for optimizing the last integrating stage by taking into account a pre-calculated frequency response of the CIC filter.

16. The method of claim 10, further comprising
 sequentially multiplying, at the input of a further integrator in the last integrating stage, each input value with a corresponding coefficient in a further set of coefficients, wherein the further set of coefficients comprises at least one zero; and
 decimating an output of the further integrator in the last integrating stage and supplying further decimated values to the differentiator of the CIC filter.

17. A hardware-efficient finite impulse response (FIR) filter embedded in a cascaded-integrator-comb (CIC) filter comprising:
 an input to receive signal values from an integrating stage of the CIC filter; and
 a multiplier to implement time-varying input gain based on a set of coefficients selected to sparsely correspond to a desired response of the FIR filter, and sequentially multiply each signal value with a corresponding coefficient of the set of coefficients;
 an integrator to integrate an output from the multiplier; and
 a decimator to decimate an output of the integrator;
 wherein the set of coefficients comprises at least one zero, and the multiplier disables the integrator when the corresponding coefficient of the set of coefficients is zero for a given cycle.

18. The hardware-efficient FIR filter of claim 17, further comprising:
 a further multiplier to implement time-varying input gain based on a further set of coefficients selected to sparsely correspond to the desired response of the FIR filter, and sequentially multiply each signal value with a corresponding coefficient of the further set of coefficients;
 a further integrator to integrate an output from the multiplier;

a further decimator to decimate an output of the further integrator; and logic to combine an output from the decimator and the further decimator;

wherein the further set of coefficients comprises at least one zero, and the further multiplier disables the further integrator when the corresponding coefficient of the set of coefficients is zero for a given cycle.

19. A hardware-efficient cascaded-integrator-comb (CIC) filter having an improved frequency response, comprising:

an integrator;

time-varying input gain logic, at an input of the integrator, to receive input values from a previous integrator stage in a CIC filter and sequentially apply a corresponding gain coefficient from a set of gain coefficients to each input value, wherein the set of gain coefficients are restricted to values between +4 and −4, and the set of gain coefficients sparsely correspond to a desired finite impulse response filter;

a decimator to decimate an output of the integrator; and one or more differentiators in series after the decimator.

20. The hardware-efficient CIC filter of claim 19, wherein the set of gain coefficients are selected from a restricted set of values comprising: 0, −1, +1, −2, and +2.

21. A hardware-efficient finite impulse response (FIR) filter embedded in a cascaded-integrator-comb (CIC) filter comprising:

a first integrator, having a first time-varying input gain logic, to receive an output from a previous integrator stage in the CIC filter, wherein the first time-varying input gain logic applies a first set of coefficients; and a second integrator, in parallel to the first integrator, having a second time-varying input gain logic, to receive the output from the previous integrator stage in the CIC filter, wherein the second time-varying input gain logic applies a second set of coefficients;

a first decimator block to decimate an output of the first integrator;

a second decimator block to decimate an output of the second integrator;

a delay unit at an output of the first decimator block; and an adder to combine an output of the delay unit and an output of the second decimator block;

wherein the first set of coefficients and the second set of coefficients sparsely correspond to a desired response of the FIR filter.

22. The hardware-efficient FIR filter of claim 21, further comprises:

a chain of differentiators to receive an output from the adder.

23. The hardware-efficient FIR filter of claim 21, wherein the first set of coefficients and the second set of coefficients are selected from a restricted set of values comprising: 0, −1, +1, −2, and +2.

24. The hardware-efficient FIR filter of claim 21, wherein the delay unit delays the output of the first decimation block by one output cycle.

25. A hardware-efficient apparatus implementing a cascaded-integrator comb (CIC) filter, comprising:

first multiplying means for sequentially multiplying values from a second to the last integrator by a corresponding coefficient in a first set of coefficients;

first integrating means for integrating a result from the first multiplying means;

first decimating means for decimating an output of the first integrating means;

delaying means for delaying an output of the first integrating means;

second multiplying means for sequentially multiplying values from a second to the last integrator by a corresponding coefficient in a second set of coefficients;

second integrating means for integrating a result from the second multiplying means;

second decimating means for decimating an output of the second integrating means;

means for combining outputs from the delaying means and the second decimating means and providing the combined outputs to a chain of differentiators; and wherein the first set of coefficients and the second set of coefficients are constrained to integers between +4 and −4.

26. The apparatus of claim 25, wherein the first set of coefficients and second set of coefficients are selected to provide attenuation at a first stopband.

27. The apparatus of claim 25, wherein the first set of coefficients and the second set of coefficients are further constrained to values of +1, 1, and 0.

* * * * *